United States Patent [19] [11] 4,379,944
Borden et al. [45] Apr. 12, 1983

[54] GROOVED SOLAR CELL FOR DEPLOYMENT AT SET ANGLE

[75] Inventors: Peter G. Borden, Menlo Park; Ronald L. Bell, Woodside; Syed B. Hyder, Los Altos Hills, all of Calif.

[73] Assignee: Varian Associates, Inc., Palo Alto, Calif.

[21] Appl. No.: 232,062

[22] Filed: Feb. 5, 1981

[51] Int. Cl.³ .............................. H01L 31/06
[52] U.S. Cl. ..................... 136/259; 136/246; 136/255; 136/256; 357/30
[58] Field of Search ............. 136/255, 256, 246, 259, 136/249 MS; 357/30

[56] References Cited

U.S. PATENT DOCUMENTS 2,320,185  5/1943  Lamb ............................. 136/256
3,419,434 12/1968  Colehower ..................... 136/246
4,135,950  1/1979  Rittner ........................... 136/255
4,200,472  4/1980  Chappell et al. .............. 136/246

OTHER PUBLICATIONS

R. R. Lucero, "The Ecliptic-Line V-Grooved Hyperjunction Cell," *Conf. Record, 14th IEEE Photovoltaic Specialists Conf.* (1980), pp. 1386–1387.

C. R. Baraona et al., "V-Grooved Silicon Solar Cells," *Conf. Record, 11th IEEE Photovoltaic Specialists Conf.* (1975), pp. 44–48.

*Primary Examiner*—Aaron Weisstuch
*Attorney, Agent, or Firm*—Stanley Z. Cole; Norman E. Reitz; Keiichi Nishimura

[57] ABSTRACT

A grooved solar cell for deployment at a set angle with respect to incoming radiation has reduced contact obscuration and series resistance. A regular array of walls formed by grooves in a crystalline semiconductor substrate is exposed to incoming radiation. Metallic contacts are formed on those walls of the grooves which are not to be exposed to sunlight. The solar cell is mounted in an apparatus at a set angle with respect to incoming radiation. The array of walls is exposed to incoming radiation while the walls with metal contacts are substantially shadowed. In a preferred embodiment the grooves are formed by using orientation specific etches.

8 Claims, 7 Drawing Figures

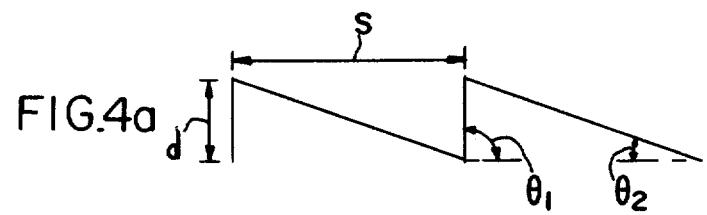
FIG.4a
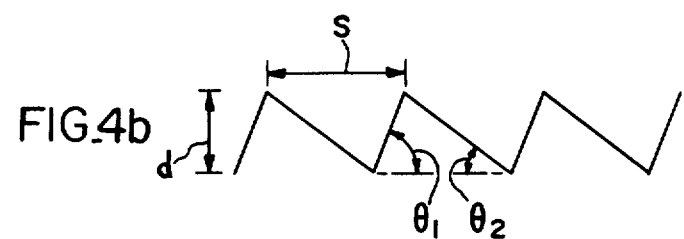
FIG.4b
FIG.5a
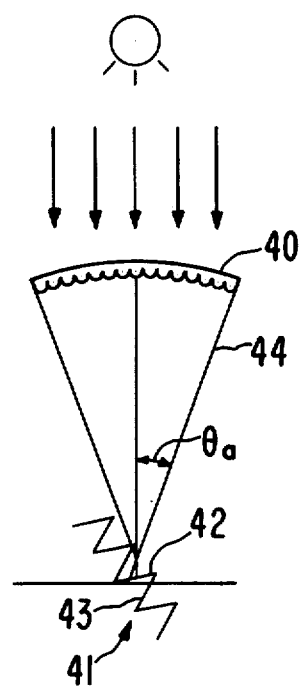
FIG.5b
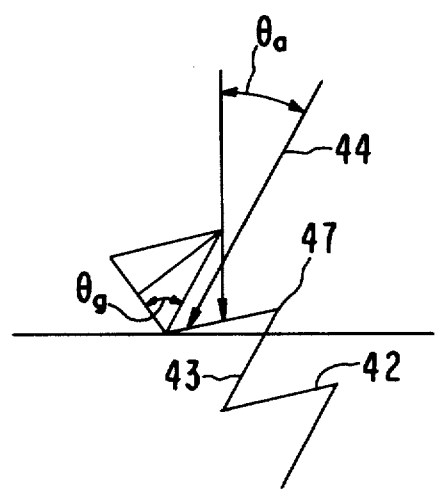

GROOVED SOLAR CELL FOR DEPLOYMENT AT SET ANGLE

DESCRIPTION

This invention relates to a solar cell with reduced series resistance and contact obscuration and, more particularly, relates to a solar cell having grooves configured in the surface thereof for mounting at a set angle with respect to incoming radiation.

In the development of terrestrial photovoltaics the design and development of cost effective systems has been a primary goal. For both flat plate and concentrator solar cells one design criterion has been the reduction of series resistance and contact obscuration. Fine line contact patterns and low resistance metal-to-semiconductor contacts have been used to achieve this criterion. Concentrator solar cells, however, are fabricated to operate under high illumination conditions and necessarily experience high electrical currents. As a consequence, the contacts must be large enough to handle the high currents, thereby detracting from the full achievement of the design criterion of reduced contact obscuration.

Flat plate solar cells have planar surfaces which are typically mounted on a fixed structure and receive diffuse sunlight from all directions and direct sunlight from different directions as the sun moves across the sky. In order to avoid losses by reflection and to obtain multiple passes through semiconductor material, these surfaces may be contoured. It has been found that less sunlight is reflected if the surface is roughened or texturized, or if grooves are formed before the p-n junction is formed. See e.g., G. Storti, et. al., "Development of an Improved High Efficiency Thin Silicon Solar Cell," NTIS Report N79-31767 (1979).

Cells may also be stacked or otherwise packed together into monolithic, series-connected high voltage cells. For example, the so-called v-groove multijunction solar cell consists of an array of individual cells which are bonded together on a glass backing to produce a high voltage, low current cell. This cell is not truly monolithic, i.e., the individual cells are not produced in the same substrate, and the grooves are positioned on the side of the cell not exposed to sunlight. See T. I. Chappell, "The V-Groove Multijunction Solar Cell", Proc. 13th IEEE Photovoltaics Conference, p. 791 (1978).

The EMVJ cell has a planar surface with narrow vertical grooves etched into the substrate. Filling these grooves with metal by plating provides low series resistance contacts that have a small aspect to the incoming light, thereby reducing obscuration. Optimization of this design necessitates the use of deep, narrow grooves, formed by anisotropic etching on 110 orientation silicon. It also requires the reliable and reproducible application of etching, diffusion and plating processes within these grooves. See e.g., R. I. Frank and J. L. Goodrich, "A Low Series Resistance Silicon Photovoltaic Cell for High Intensity Applications," *Proceedings, 14th IEEE Photovoltaics Specialists Conference*, p. 423 (1980).

The IBC cell has a planar front surface, with alternating polarity diffusions on the back. Contact is made to these diffusions, usually with an interdigital pattern. This structure minimizes obscuration by using back contacts, and may have a textured surface for the purpose of minimizing reflection losses. See e.g., R. J. Schwartz and M. D. Lammert, "The Interdigitated Back Contact Solar Cell: A Silicon Solar Cell for Use in Concentrated Sunlight," *IEEE Transactions on Electron Devices*, Vol. 24, pp. 337 (1977).

SUMMARY OF THE INVENTION

It is an object of the present invention to provide a grooved solar cell for deployment at a set angle with respect to incoming radiation which has reduced contact obscuration and series resistance. A regular array of walls formed by the grooves is selected for exposure to incoming radiation. Metallic contacts are applied to those walls of the grooves which are not to be exposed to sunlight. The solar cell is mounted in an apparatus, such as an active tracker, at a set angle with respect to incoming radiation so that the array of walls is exposed to incoming radiation while the walls with contacts are substantially shadowed. Low series resistance is obtained with minimal obscuration. In a preferred embodiment the grooves are formed by using orientation specific etches.

BRIEF DESCRIPTION OF THE DRAWINGS

For a more complete understanding of the present invention, reference is hereby made to the drawings which are incorporated herein by reference and in which:

FIGS. 4a–4b are groove profiles for two additional crystallographic orientations of the substrate; the grooves having a constant depth d and variable spacing s; and FIGS. 5a–5b are, respectively, a pictorial view of a grooved concentrator solar cell mounted in fixed relationship with respect to a Fresnel lens and the associated angular relationships.

DESCRIPTION OF THE PREFERRED EMBODIMENTS

Conventional solar cells are fabricated from single crystal wafers which are sawn from ingots. The wafers are on the order of 200 μm thick. The pn junctions are formed in the uppermost region of the wafer and the lower region (the base) serves to absorb radiation (especially for silicon) and to transport photocurrent. Within this thickness there is ample room to form grooves and yet maintain structural integrity. If the walls of the grooves are utilized as active surfaces, then even thinner wafers may be used, providing the cell is tilted so the active wall surfaces are generally normal to incoming radiation and the radiation can pass through successive grooved segments until it is absorbed. The grooved cell of the present invention is thus predicated upon receiving incident radiation on the walls of grooves in lieu of a top planar surface and upon tilting the cell at an appropriate fixed angle with respect to the incoming radiation. Metal contact lines are applied to opposing walls. This structure is suitable for both non-concentrated and concentrator arrays.

In the operation of most concentrator solar systems the light which reaches the cell is close to being collimated. This condition obtains for parabolic relections; for a Winston-type concentrator there is some angular speed in the incident light. Therefore, the grooved solar cell of the present invention may readily be tilted in an appropriate concentrator with respect to the direction of the incoming collimated light with the expectation that the angle between the incoming radiation and the plane of the cell will remain constant under varied operating conditions. The angle of tilts is selected so that substantially all incoming radiation impinges on unmetallized areas. Since top contact metallization is placed on the walls of the grooves which are shadowed from the suns, obscuration may be essentially eliminated; in addition, thick contact lines may be used, thereby reducing series resistance and increasing efficiency.

Figure 1:
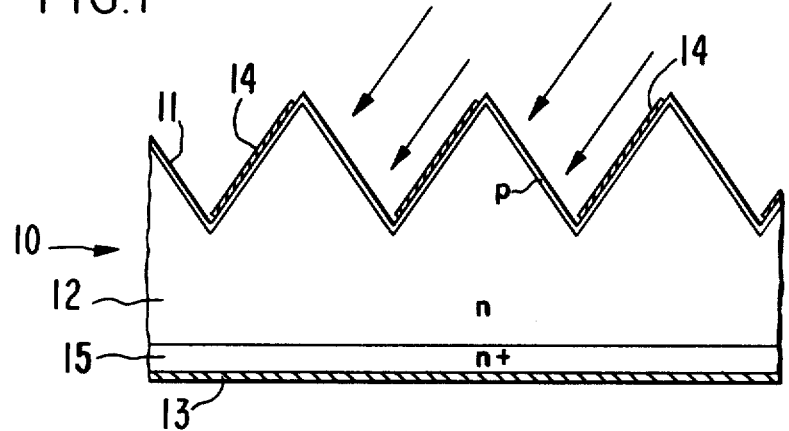
FIG. 1 is a cross-sectional view of the grooved concentrator cell oriented to receive incoming light on unmetallized walls.
Figure 2:
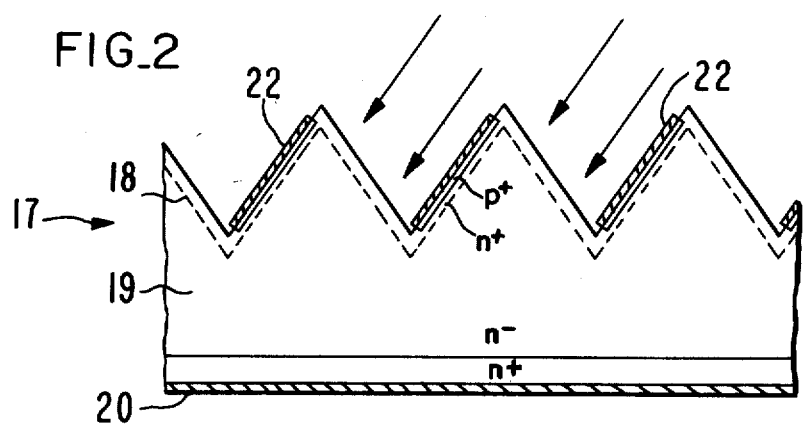
FIG. 2 is a cross-sectional view of an alternate embodiment of the grooved concentrator solar cell showing a hi-low emitter structure.
Figure 3:
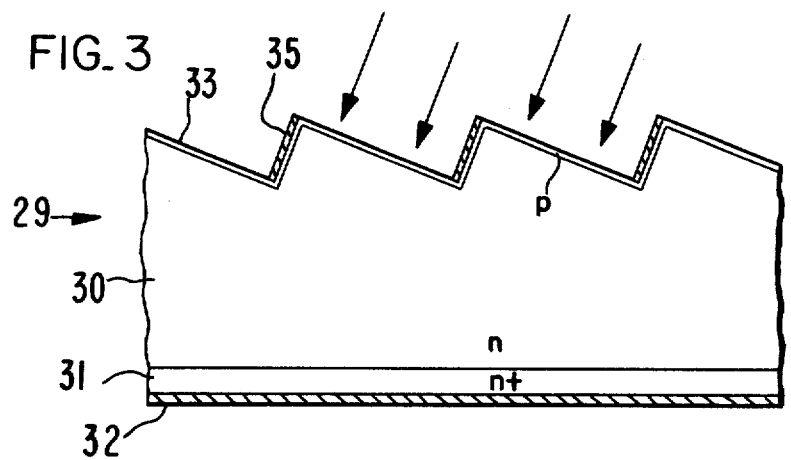
FIG. 3 is a cross-sectional view of a grooved concentrator solar cell having asymmetric walls formed along particular crystallographic planes.

The structure of the V grooved concentrator solar cell of the present invention is shown generally in FIGS. 1-3 (10, 17 and 29). This structure provides the desired combination of processing simplicity (with associated low cost) and high performance. It consists of a V-grooved surface with a p-n junction formed in selected walls of the grooves. This junction may be formed by diffusion or by ion implantation. Other walls of the regularly oriented grooves are covered with contact metallization. In position in a mounting apparatus such as a concentrator system the cell is held in a set position so that light illuminates the walls that are not metallized and substantially shadows the metallized walls. This structure possesses the following features and advantages:

(1) Fabrication is straightforward. A single photomask and etch step forms the grooves. After this, all processes proceed without masking. This is because evaporative deposition of metal or dielectrics, ion etching, and ion implantation are all available as beam processes that are directed at appropriate walls of the grooves by merely tilting the cell.

(2) The cell permits a high fill factor for the finished cell. Up to 50% of the surface can be covered with contact metal, with coverage being controlled by the tilt angle of the cell during evaporative deposition of the metal. The choice of amount of surface area to cover with metal contacts requires a tradeoff between lowering series resistance and raising surface recombination since the metal-semiconductor interface provides sites for recombination. One tenable approach is to use narrow but thick metallization strips.

(3) Another advantage of that most photocurrent is generated within the triangularly shaped segments near a contact, so that long minority carrier lifetime is less critical than with conventional planar cells.

(4) The oblique incidence angle allows use of thinner substrates to reduce base resistance.

(5) The finished cell has nearly zero obscuration.

The grooves of the cell of the present invention may preferably be fabricated by using anisotropic etch techniques. Many single crystal semiconductor materials are known to be amenable to anisotropic etchings. This anisotropy has been used to advantage in processing such single crystalline materials, e.g., single crystal silicon, for both semiconductor and solar cell applications. See e.g., D. L. Kendall, "Vertical Etching of Silicon at Very High Aspect Ratios," *Ann. Rev. Material Science* (1979), Vol. 9, pp 373-403; K. E. Bean, "Anisotropic Etching of Silicon", *IEEE Trans Electron Devices*, Vol. Ed-25, October 1978, p. 1185; H. Kinoshita et al, "Anisotropic Etching of Silicon by Gas Plasma," *Japan J. Appl Phys*, Vol. 16, p. 381 (1977); and D. L. Kendall, "On Etching Very Narrow Grooves in Silicon", *Appl Phys Ltrs*, Vol. 26, February 1975, p. 195. As set out in these references, regular and irregular grooves in silicon may be obtained by utilizing anisotropic etches. Also, such grooves can be produced in III-V compound semiconductor materials. See e.g., Y. Tarui, Y. Komiya and Y. Harada, "Preferential Etching and Etched Profile of GaAs", *J. Electrochem Soc.*, Vol. 118, 118 (1971); W. T. Tsang and S. Wange, "Profile and Groove Depth Control in GaAs Diffraction Gratings Fabricated by Preferential Chemical Etchings in $H_2SO_4$, $H_2O_2$, $H_2O$ System", *Appl. Phys. Letters*, Vol. 28, 44, (1976); R. Sankaran, S. B. Hyder and S. G. Bandy, "Selective In-Situ Etch and Growth of GaAs", *J. Electrochem Soc.*, Vol. 126, 1241 (1979); T. Uragaki, H. Yamanaka and M. Inoue, "Selective Etchings of GaP Crystals with Hot Phosphoric Acid", *J. Electrochem Soc.*, Vol. 123, 580, (1976). Essentially, one can produce grooves with walls of arbitrary but regular and predictable angles by choosing the orientation of the starting material and the particular etch.

The following examples serve to illustrate the processes that may be used to fabricate grooved solar cells in accordance with the present invention.

EXAMPLE I

A slice of (100) crystal orientation silicon of 200 $\mu$m thickness was selected. Narrow lines of $SiO_2$ of 8 $\mu$m width, 1 $\mu$m thickness and spaced 50 $\mu$m apart were formed using standard photolithographic techniques. The silicon was then etched in hot $KOH/H_2O$ for 250 minutes until grooves of a depth of about 35 $\mu$m were obtained. The $SiO_2$ lines were removed and a P-type layer (boron) 11 was diffused into the n-type substrate 12 to a junction depth of 0.5 $\mu$m. The back surface field was formed by diffusing an $n^+$-type region (phosphorous) 15 onto the back side of the wafer. Then back side contacts were made by applying a conductive layer 13 such as Ti-Pd-Ag. The front side contacts 14 were applied by tilting the cell and evaporating Ti-Pd-Ag onto the exposed walls. An antireflection coating of $Ta_2O_5$ was then evaporated on the groove walls opposite the metallized walls. Contacts can then be plated thicker with either Ag or Au. In positioning the cell in a concentrator, the metallized walls will be positioned to avoid incoming solar radiation, by tilting the cell with respect to the optic axis of the concentrator.

EXAMPLE II

An $n^-$-type substrate 19 of (100) orientation is selected. Grooves are etched. An $n^+$-type region (18 and 20) is diffused in the front and the back of the substrate to produce surface fields thereby reducing surface recombination at the front and back surfaces. $p^+$-type regions are produced along one side of each groove by ion implantation which is accomplished while the wafer is held at a fixed tilt angle within the implanter. The implant is then annealed. Metal contacts 22 are then applied over the $p^+$ regions by appropriate tilting in an evaporator. An antireflection coating is then added to the grooves.

Advantages of this cell structure are reduced emitter resistance, reduced front surface recombination, and better blue response. The advantages of the v-groove concentrator solar cells configuration of avoidance of obscuration and low series resistance are retained.

EXAMPLE III

V-groove cells with a structure such as those described in examples I and II and shown in FIGS. 1. and 2, respectively, can be made using substrates of higher order crystal plane than 100. The grooves become increasingly asymmetric as the crystal planes become of higher order as shown in the most pronounced way in FIG. 4a. This asymmetry produces lesser and lesser requirement for tilting of the cell in use (see FIG. 3 wherein Nos. 30, 31, 32, 33 and 35 correspond respectively to Nos. 12, 15, 13, 11 and 14 of FIG. 1), although it reduces the surface area available for application of contacts. Thus, a lesser tilt angle is required for FIG. 4a than for FIG. 4b. This reduction of tilt angle may be desirable when the v-groove cell is used in a high numerical aperture concentrator, i.e., whenever the incoming radiation has an angular distribution. Use of the shorter metallization step 35, e.g., as shown in FIG. 3, would allow for reduced obscuration for large values of angular spread. For such an angular spread in the case of the grooved cell of FIGS. 1 and 2, the active walls would be illuminated nonuniformly and the metallized walls would intercept some of the illumination. This intercepted radiation could be partially recovered by making the metallization reflective (e.g., metallized aluminum). However, the asymmetric grooves of FIG. 3 are a more satisfactory resolution of this problem. Their use is only limited by the desire to obtain effective contacts which produce low series resistance.

When deployed, the cell will be tilted in a fixed position with respect to the incident light. The cell can assume an arbitrary orientation with respect to the incident light as determined by the apparatus in which it is mounted. In most applications the apparatus in which the cell is mounted will actively track the sun in order to maintain the fixed tilt angles. However, tracking is more critical for concentrator applications than for flat plate arrangements; in the latter a fixed tilt angle may be selected which, on an integrated basis, presents the cell for receiving the most incident radiation. Thus, the unmetallized walls of the grooves may be exposed to sunlight whereas the metallized walls are substantially shadowed from the sunlight. Obscuration may thereby be essentially eliminated. In addition, the series resistance of the cell may be arbitrarily low as determined by choice of groove spacing, fraction of groove wall covered (through choice of tilt angle during metallization), choice of metal and metal thickness. In some concentrator applications the normal to the active surface (walls) of the cells may be deliberately oriented off the axis of the optical concentrator in order to obtain a wider acceptance angle for light entering the concentrator. This angle $\theta_a$ is shown in FIGS. 5a-5b for a Fresnel lens concentrator arrangement 40. It is the angle over which rays of light may be transmitted to a grooved cell without directing light at metallized walls 43. The necessary condition for an acceptance angle, $\theta_a$ to exist, is that the cell 41 be tilted to at least the minimum tilt angle $\theta_{tm}$ where $$\theta_{tm} = 90° - \theta_g$$

$\theta_g$ = groove angle.

At this tilt angle the extreme ray 44 of the distribution of light rays through the total acceptable angular districution $2\theta_a$ is parallel to metallized walls 43. For a lesser tilt angle, e.g., $\theta_t < \theta_{tm}$ some radiation will impinge on metallized wall 43. For a greater tilt angle, $\theta_t > \theta_{tm}$, a larger cell may be required in order to capture all radiation that does not fall on a given wall 42, but passes over the peak 47 to the next wall 42. The acceptance angle is given by $\theta_a = \theta_t - \theta_{tm}$.

We claim:

1. A solar cell for deployment at a set angle with respect to incoming radiation comprising:
   a wafer of a semiconductor material having a series of grooves formed on the front surface thereof, said grooves forming first and second sets of sidewalls, all of the sidewalls of each set being oriented in generally the same direction;
   a network of metal contact lines formed on at least some of the sidewalls of said first set, whereby the body of said cell may be tilted to receive incoming radiation in a manner such that substantial amounts of said incident radiation impinges on said sidewalls of said second set and said network of metal contact lines is substantially shadowed;
   a pn junction formed in at least a portion of said sidewalls of said grooves;
   contact metallization formed on the back surface of said wafer; and
   apparatus for receiving and maintaining said solar cell at a set angle with respect to incoming radiation.

2. A solar cell in accordance with claim 1 wherein said apparatus for receiving and maintaining said cell comprises a concentrator.

3. A solar cell in accordance with claim 2 wherein said series of grooves are aligned in parallel.

4. A solar cell in accordance with claim 3 wherein said pn junction is formed by ion implantation.

5. A solar cell in accordance with claim 2 wherein said wafer is composed of a single crystal material having a crystallographic plane of a higher order than 100.

6. A solar cell in accordance with claim 2 wherein said concentrator has a high-numerical aperture.

7. A solar cell in accordance with claim 2 wherein said wafer is of n-type material, and an n+-type back surface field region is formed in the back side of said wafer and said contact metallization is formed on said back surface field region of said wafer.

8. A solar cell in accordance with claim 2 wherein said wafer is of n⁻-type material, and an n+-type front surface field region is formed in the front side of said wafer in said n⁻-type wafer prior to formation of said pn junction.

* * * * *